United States Patent
Noehte et al.

(10) Patent No.: US 7,123,340 B2
(45) Date of Patent: Oct. 17, 2006

(54) LITHOGRAPH WITH MOVING LENS AND METHOD OF PRODUCING DIGITAL HOLOGRAMS IN A STORAGE MEDIUM

(75) Inventors: Steffen Noehte, Weinheim (DE); Christoph Dietrich, Heidelberg (DE); Robert Thomann, Heidelberg (DE); Stefan Stadler, Hamburg (DE); Jörn Leiber, Hamburg (DE)

(73) Assignee: Tesa Scribos GmbH, Heidelberg (DE)

( * ) Notice: Subject to any disclaimer, the term of this patent is extended or adjusted under 35 U.S.C. 154(b) by 188 days.

(21) Appl. No.: 10/472,970

(22) PCT Filed: Mar. 28, 2002

(86) PCT No.: PCT/EP02/03517

§ 371 (c)(1),
(2), (4) Date: Mar. 30, 2004

(87) PCT Pub. No.: WO02/079881

PCT Pub. Date: Oct. 10, 2002

(65) Prior Publication Data

US 2004/0150802 A1     Aug. 5, 2004

(30) Foreign Application Priority Data

Mar. 30, 2001    (DE)  ............... 101 16 059

(51) Int. Cl.
*G03B 27/00*    (2006.01)
*G03B 27/54*    (2006.01)
*G03H 1/04*     (2006.01)

(52) U.S. Cl. ............... 355/2; 355/67; 359/35; 430/1

(58) Field of Classification Search ............ 355/2, 355/53, 67; 359/9, 35, 30, 31; 365/125, 365/216; 430/1; 347/241, 242, 262

See application file for complete search history.

(56) References Cited

U.S. PATENT DOCUMENTS 4,844,568 A    7/1989   Suzuki et al.

(Continued)

FOREIGN PATENT DOCUMENTS

WO    WO 94/10684    5/1994

(Continued)

*Primary Examiner*—Alan Mathews
(74) *Attorney, Agent, or Firm*—Proskauer Rose LLP

(57) ABSTRACT

The invention relates to a lithograph for producing digital holograms in a storage medium (4), having a light source (6, 10) for producing a write beam (12) with a predefined beam cross section, having a writing lens (14) for focusing the write beam (12) onto the storage medium (4) to be written, the writing lens (14) being arranged in a lens holder (16), and having drive means for the two-dimensional movement of the write beam relative to the storage medium. The technical problem of writing computer-generated holograms as quickly as possible and with little effort by means of optical lithography is solved in that a first drive device (18) is provided for moving the lens holder (16) substantially at right angles to the write beam (12) and in that the aperture of the writing lens (14) is smaller than the beam cross section of the write beam (12).

The inventon also relates to a method for the lithographic production of a hologram in a storage medium.

25 Claims, 4 Drawing Sheets

U.S. PATENT DOCUMENTS

| | | | |
|---|---|---|---|
| 6,002,466 A * | 12/1999 | Brauch et al. | 355/53 |
| 6,133,986 A * | 10/2000 | Johnson | 355/67 |
| 6,177,980 B1 | 1/2001 | Johnson | |
| 6,185,019 B1 * | 2/2001 | Hobbs et al. | 359/30 |
| 6,379,867 B1 * | 4/2002 | Mei et al. | 430/296 |
| 6,586,169 B1 | 7/2003 | Brauch et al. | |
| 2001/0021484 A1 | 9/2001 | Brauch et al. | |

FOREIGN PATENT DOCUMENTS

| | | |
|---|---|---|
| WO | WO 99/59035 | 11/1999 |
| WO | WO 0072092 | 11/2000 |

\* cited by examiner

LITHOGRAPH WITH MOVING LENS AND METHOD OF PRODUCING DIGITAL HOLOGRAMS IN A STORAGE MEDIUM

BACKGROUND OF THE INVENTION

The present invention relates to a lithograph for producing digital holograms in a storage medium. In particular, the lithograph has a light source for producing a write beam with a predefined beam cross section, a writing lens for focusing the write beam onto the storage medium to be written, the writing lens being arranged in a lens holder, and having drive means for the two-dimensional movement of the write beam relative to the storage medium. Furthermore, the invention relates to a method of producing digital holograms in a storage medium.

Digital holograms are two-dimensional holograms which consist of individual points with different optical properties and from which, when illuminated with a coherent electromagnetic wave, in particular a light wave, images and/or data are reproduced by means of diffraction in transmission or reflection. The different optical properties-of the individual points can be reflective properties, for example as a result of surface topography, varying optical path lengths in the material of the storage medium (refractive indices) or color values of the material.

The optical properties of the individual points are calculated by a computer, and this thus involves what are known as computer-generated holograms (CGH). With the aid of the focused write beam, during the writing of the hologram the individual points of the hologram are written into the material, the focus being located in the region of the surface or in the material of the storage medium. In the region of the focus, focusing has the effect of a small area of action on the material of the storage medium, so that a large number of points of the hologram can be written on a small area. The optical property of the respectively written point in this case depends on the intensity of the write beam. For this purpose, the write beam is scanned in two dimensions over the surface of the storage medium with varying intensity. The modulation of the intensity of the write beam is in-this case carried out either via internal modulation of the light source, for example a laser diode, or via external modulation of a write beam outside the light source, for example with the aid of optoelectronic elements. Furthermore, the light source can be formed as a pulsed laser whose pulse lengths can be controlled, so that control of the intensity of the write beam can be carried out via the pulse lengths.

As a result of the scanning of the intensity-modulated write beam, an area with an irregular point distribution is thus produced, the digital hologram. This can be used to identify and individualize any desired objects.

Scanning lithographic systems are intrinsically widespread. For example, scanning optical systems are incorporated in conventional laser printers. However, these systems cannot be used for the-production of holograms, since the requirements for this intended application differ considerably from those in laser printers. In the case of good printing systems, the resolution is around 2500 dpi while, in the production of holograms, a resolution of about 25 000 dpi is required. In addition, in digital holography, only comparatively small areas are written. These are, for example, 1 to 5 $mm^2$, other sizes also being possible. The accuracy of the write pattern in the case of a lithograph for the production of digital holograms of, for example, 1000×1000 points on an area-of 1×1 $mm^2$ must be about ±0.1 µm in both orthogonal directions. Furthermore, the writing speed should be about 1 Mpixel/s, in order that in each case a hologram can be written in a time of about 1 s. The aforementioned magnitudes are exemplary and do not constitute any restriction of the invention.

Digital holograms can be produced by means of conventional scanning methods, in which the angle of the incident beam is varied by stationary optics. For example, scanning mirror lithographs with galvanometer and polygonal scanners operate on this principle. However, scanners of this type have the disadvantage that the implementation of this principle entails a great deal of optical and mechanical effort. This fact places tight limits on the maximization of the speed and the resolution of optical lithographs, since, for this purpose, objectives are needed which permit a large field angle and convert the deflection angle, preferably linearly, into an x deflection in the focal plane of the objective ("F-theta" objectives). Moreover, the objectives used have to be corrected with regard to the image curvature ("flat field" objectives), so that complicated multi-part optics have to be used which are an obstacle to a compact configuration of the lithograph. Furthermore, complex optics of this type place great demands on the mechanics of the lithograph, since the latter have to move a relatively large mass. This also results from the fact that it is not possible to select arbitrarily small scanning mirrors, since the aperture of the optical system always determines the resolution as well.

However, scanning optical systems are also known in which the scanning movement is not achieved via a moving beam but via moving optics. However, the scanning speeds and accuracies of the positioning of the write beam which permit a predefined point pattern of the digital hologram to be maintained for the writing speeds to be achieved are not achieved here either.

SUMMARY OF THE INVENTION

The present invention is therefore based on the technical problem of writing computer-generated holograms as quickly as possible and with little effort by means of optical lithography.

According to a first teaching of the invention, the technical problem indicated above is solved by a lithograph having the features of claim 1, by a drive device being provided to move the lens holder substantially at right angles to the write beam and by the aperture of the writing lens being smaller than the beam cross section of the write beam.

Thus, using the lithograph according to the invention, the digital holograms are produced by means of an oscillating scanning movement of the write beam in a first direction of movement, which is implemented by moving optics. This is based on the principle that the focal point of a lens moves in a fixed relation with the latter when the lens is moved at right angles to a beam, preferably a well-collimated beam. If the blame has a sufficiently flat wavefront and if its cross section is greater than the aperture of the lens, then a scanning movement of the focus may be achieved by moving the lens, without locally-dependent fluctuations of the beam intensity occurring at the focal point.

This solution offers the advantage of permitting a scanning movement at high speed without large masses having to be moved. The mass to be moved is reduced as compared with the prior art since only the writing lens is still moved but not, in addition, at least one further mirror including its mount.

In this connection, a high speed of the scanning movement means an oscillation rate in the region of 1 kHz. This is because the hologram, which, for example, comprises 1000×1000 points, is to be written in one second, so that, in the first direction of movement, 1000 lines each having 1000 points are written. A large number of direction changes therefore occur.

The region to be scanned in order to produce digital holograms is typically 1 to 5 mm² in size and is thus considerably smaller than the aperture of a typical objective lens. A typical objective lens is in this case understood to mean a lens which has a numerical aperture (NA) of preferably 0.4 or more, an aperture of preferably 4 to 6 mm and a weight of less than one gram. Lenses of this type are already used for CD and DVD drives and can be produced inexpensively as aspherical singlets. The writing lens used in the present invention differs from these lenses, however, in the cover glass thickness correction, which has to be matched to the respective intended purpose.

DETAILED DESCRIPTION OF THE INVENTION

The invention will be explained in more detail below using preferred embodiments.

The drive device is preferably formed as a linear motor or as a voice coil motor. Both drives are suitable for generating the high scanning speeds or oscillation rates of the lens holder.

The mounting of the lens holder is preferably carried out with solid-state joints. The lens holder and therefore the writing lens can thus oscillate resonantly in the first direction of movement, preferably at a frequency which is greater than 1 kHz. Instead of the solid-state joints, other mountings of the lens are also possible, for example stressed ball bearings, sliding bearings, air bearings or magnetic bearings. However, as compared with the preferred mounting with solid-state joints, these have the disadvantage that they involve higher wear or greater technical effort. The important factor in configuring the mounting is that the lens is mounted with high precision. In this case, the path deviation laterally with respect to the direction of movement must be less than 0.2 mm and in the beam direction must be at most 0.5 mm. In addition, the tilting of the lens must be very low, since otherwise the quality of the focal point is not ensured.

The scanning movement of the writing lens can be designed to be linear or rotational, depending on the type of mounting. In the case of a linear scanning movement, a linear exposure track is produced on the storage medium while, in the case of a scanning movement about a rotational axis, in each case circular arcs are passed through. If, in this case, the radius is large as compared with the length of the scanning movement, then a rectilinear course of the scanning movement can be assumed to a good approximation. In any case, the curved course of the scanning movement can be taken into account by computation when producing the computer-generated hologram, by the point arrangement deviating from an orthogonal pattern being used as a basis.

The mounting of the writing lens in the manner illustrated permits the movement of the lens in only one direction. However, since arrays are exposed in order to produce two-dimensional digital holograms, a further scanning movement in a second direction by the drive means is required. This transverse movement has a component at right angles to the first direction of movement, in particular this runs substantially at right angles to the first direction of movement.

A movement transversely with respect to the oscillating movement of the writing lens can be achieved, for example, by a second drive device being provided for moving the write beam relative to the storage medium in a second direction of movement transversely with respect to the first direction of movement. The production of this relative transverse movement is possible in various ways.

In a first preferred way, the second drive device moves the lens holder of the writing lens relative to the write beam. Secondly, the second drive device can move the light source, the collimation optics and the lens holder of the writing lens relative to the storage medium. Thirdly, the second drive device can move the storage medium itself relative to the light source, collimation optics and writing lens. In each of the cases described above, a relative movement between write beam and storage medium is produced which is carried out transversely, in particular at right angles, to the first direction of movement of the writing lens. This movement along the second direction of movement is likewise carried out with high precision. Depending on the practical application, preference is generally given to the configuration which is associated with the lowest mass to be moved.

The technical problem indicated above is solved by a further configuration of the present invention which is independent of the configuration of the first and second drive devices and in general is based on a lithograph with light source, collimation optics, writing lens and two-dimensional drive means. The solution resides in the fact that the writing lens is formed as a microlens. The microlens has a physical dimension, in particular a diameter, substantially of the order of magnitude of the hologram to be produced.

In the present invention, the dimension of the digital holograms lies in the range from 1 to 5 mm. As a result of the small size of the writing lens, the weight of the lithograph to be moved is reduced, so that either the drive for producing the relative movements between the write beam and the storage medium needs to be less complicated or higher writing speeds can be achieved. In addition, the use of microlenses reduces the distance between the lithograph and the storage medium, so that the overall structure comprising lithograph and storage medium is reduced in size.

In a further preferred manner, at least two writing lenses are arranged beside each other, the write beam illuminating the at least two writing lenses simultaneously. If more than two writing lenses are provided, then these are preferably arranged in the form of an array. If, then, the write beam is moved relative to the storage medium, then the movement of the focused part beams let through by the individual microlenses is carried out in parallel with one another. Thus, a plurality of holograms can be written simultaneously into a hologram array, corresponding to the plurality of writing lenses.

Only the intensity of the write beam has to be increased accordingly, the respective intensities acting to the same extent on all the part beams.

The parallel writing of a plurality of identical holograms in the form of a hologram array has the advantage that a lower illumination intensity is required for subsequent reconstruction of the hologram. This is because the read beam strikes the plurality of identical holograms simultaneously, which means that the same hologram is accordingly produced frequently. These individual holograms combine to form an overall hologram with an intensity which is boosted as compared with the individual intensity.

The microlens per se and the array of writing lenses in the form of the microlenses may be used particularly advantageously in the above-described lithograph with moving writing lens. This is because the low weight of the individual writing lenses permits a fast scanning movement. In the case of an array of writing lenses, these are arranged together in the lens holder, which is moved by the first drive device and, if appropriate, by the second drive device. All the advantageous configurations described further above may now also be combined with microlenses or arrays of microlenses.

According to the invention, the technical problem indicated above is also solved by a method for the lithographic production of a digital hologram in a storage medium, a write beam being focused onto the storage medium with the aid of a light source and a writing lens and being moved two-dimensionally relative to the storage medium with the aid of drive means, in which the writing lens is moved relative to the optical storage medium in a first direction of movement substantially at right angles to the propagation direction of the write beam, in which, within the range of movement of the writing lens, the aperture of the writing lens is illuminated substantially completely by the write beam, and in which the hologram is written by introducing radiation energy point by point, the intensity of the write beam being controlled as a function of the position of the write beam on the storage medium. Depending on the intensity of the write beam, the optical properties of the material of the storage medium are thereby changed point by point.

In a preferred way, the write beam is additionally moved relative to the storage medium in a second direction of movement transversely with respect to the first direction of movement. For this purpose, there are the possibilities already explained above using the structure of the lithograph. In a first embodiment, the writing lens is moved relative to the storage medium in a second direction of movement transversely with respect to the first direction of movement. Secondly, the light source and the writing lens can be moved together relative to the storage medium. And thirdly, the storage medium itself can be moved relative to the light source and writing lens. By means of superimposing the movements along the two directions of movement, the result is two-dimensional scanning of the write beam over the surface of the storage medium, by which means the writing operation of the hologram is carried out.

In a further embodiment of the present invention, an orthogonal point pattern on the storage medium is scanned with the aid of the write beam. In other words, the two scanning movements proceed in such a way that the write beam focused by the writing lens travels over an orthogonal point pattern on the optical storage medium. In this case, the quality of the written hologram depends on the write pattern being scanned as accurately as possible.

This is preferably achieved in that, during the oscillating movement of the writing lens in the first direction of movement at high speed, that is to say along what is known as the fast axis, no movement transversely with respect to this movement is carried out as long as the optical storage medium is being written. If the writing lens then oscillates back without writing the storage medium, then the writing lens is moved by one step relative to the storage medium to be written in the second direction of movement, that is to say along what is known as the slow axis. The writing lens then remains in this position with respect to the second direction of movement until the writing movement section of the writing lens on the fast axis has again been carried out and the writing lens oscillates back again. The movement on the slow axis is thus carried out discontinuously, and the two movements have to be coordinated accurately with each other and controlled. In other words, writing on the storage medium takes place only in the forward movement along the fast axis, while the displacement of the write beam transversely thereto is carried out on the return movement.

It is likewise possible to write on the storage medium both during the forward movement and during the return movement and to carry out the transverse displacement during the reverse movement in the first direction of movement.

In order to satisfy these requirements in relation to the hologram to be written, the writing lens should oscillate on the fast axis at a frequency of about 1 kHz, while the discontinuous displacement of the writing lens in relation to the medium on the slow axis, that is to say transversely with respect to the oscillating movement, should be carried out within 0.3 to 0.6 ms. The writing trigger for modulation of the intensity of the write beam must in this case proceed at the order of magnitude of several megahertz.

As an alternative to this, the movement of the writing lens in the second direction of movement on the slow axis can be carried out continuously. However, the consequence of this is that the writing points then no longer lie on an orthogonal pattern. However, this can be compensated for by appropriate configuration of the control system, for example by appropriately constructed software.

The previously described functioning of the present invention and its preferred configurations can also advantageously be used in a scanning, in particular confocal, microscope. In a microscope of this type, the surface to be examined is scanned or observed with a light beam and the reflected light intensity is measured. During the scanning of the surface, the image is then assembled from the measured intensities of the reflected light. The surface is therefore scanned in a pattern, as has been described previously.

In the present case, for this purpose a beam splitter is arranged in the beam path of the reflected beam, in front of or preferably behind the moving lens, in order to lead the reflected radiation to an optical sensor. The latter measures the reflected intensity.

With a microscope of this type, the technical problem of scanning a surface as quickly as possible and with little effort are [sic] solved. This is in accordance with the technical problem on which the lithograph previously described is based. The advantages previously described for the lithograph are likewise achieved in a microscope of this type.

BRIEF DESCRIPTION OF THE DRAWINGS

In the following text, the invention will be described only by way of example with reference to the drawings, in which.

DETAILED DESCRIPTION OF THE DRAWINGS

Figure 1:
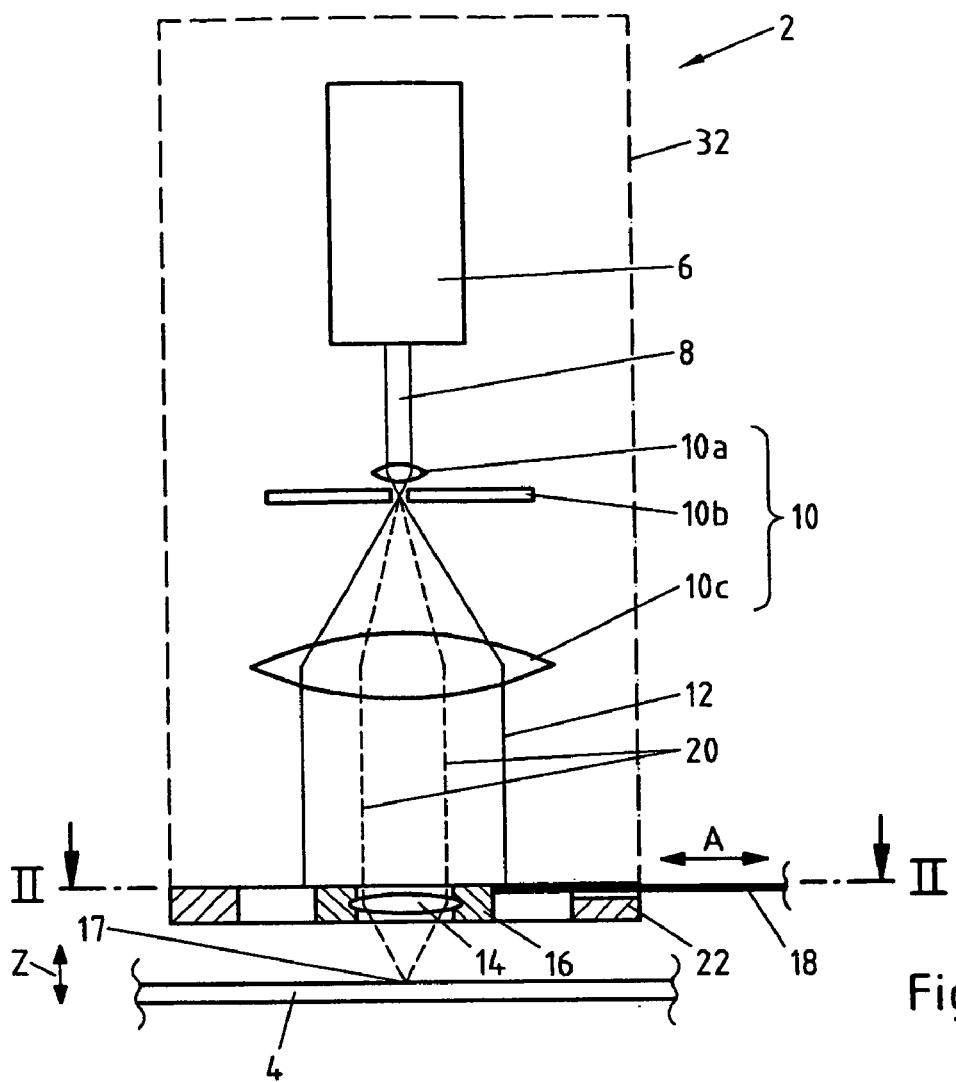
FIG. 1 shows a first exemplary embodiment of a lithograph according to the invention in a side view.
Figure 2:
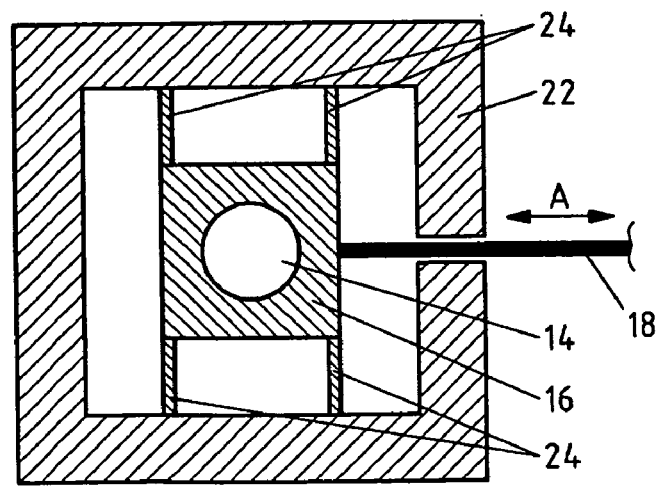
FIG. 2 shows the lithograph in cross section along the line II—II in FIG. 1, the lens holder and the linear drive being illustrated in a plan view.

A first exemplary embodiment of a lithograph 2 according to the invention for producing digital holograms in a storage medium 4 is illustrated in FIGS. 1 and 2. Said lithograph has a laser 6 for producing a write beam 8, which is widened to a predefined beam cross section by collimation optics 10 for widening and collimating the laser beam 8. For this purpose, the collimation optics 10 comprise a first focusing lens 10*a* with a small focal length, an aperture stop 10*b* and a focusing lens 10*c*, which are arranged as a three-dimensional frequency filter for extensive beam homogenization. The laser beam 8 leaves the collimation optics 10 as a widened write beam 12. The unit comprising laser 6 and collimation lens 10 therefore constitutes the light source for producing the write beam 12.

Furthermore, the lithograph 2 has a writing lens 14 for focusing the collimated write beam 12 onto the storage medium 4 to be written. The writing lens 14 is arranged for this purpose in a lens holder 16, as also illustrated in particular in FIG. 2.

By means of the writing lens 14, the write beam 12 is focused at a focal point 17 on the surface of the storage medium 4. As a result, interaction occurs between the write beam and the material of the storage medium, which means that the optical property of the material is changed locally in the region of the focal point, if the intensity of the write beam is sufficient.

According to the invention, a first drive device is provided to move the lens holder 16 substantially at right angles to the collimated write beam 12, the drive device being illustrated only partly in the form of a web 18. The web is connected to a linear drive, which carries out an oscillating movement identified by the double arrow A. As a result of the movement of the lens holder 16 and thus the writing lens 14, the focal point 17 of the writing lens is displaced accordingly on the surface of the storage medium 4. Depending on the deflection of the lens holder 16, other regions of the surface of the storage medium 4 are thus reached.

As FIG. 1 also shows, the aperture of the writing lens 14 is smaller than the beam cross section of the widened and collimated write beam 12. Thus, only part of the widened write beam 12 is focused by the writing lens 14. This part of the write beam 12 is illustrated by the dashed lines 20. If, then, the lens holder 16 is displaced by the drive device 18, the writing lens 14 is in each case located completely within the region illuminated by the widened write beam 12. This ensures that an identical proportion of the write beam 12 is focused in every point of the movement of the writing lens 14. The result is thus a constant beam intensity at the focus.

The linear drive which moves the web 18 can be designed as desired. A magnetic linear motor or a voice coil motor is preferred as the drive device. In the example illustrated, solid-state bearings 24 are used as the mounting for the lens holder 16 with respect to the frame 22. Likewise, stressed ball bearings, sliding bearings, air bearings or magnetic bearings can be used as bearings.

Figure 3:
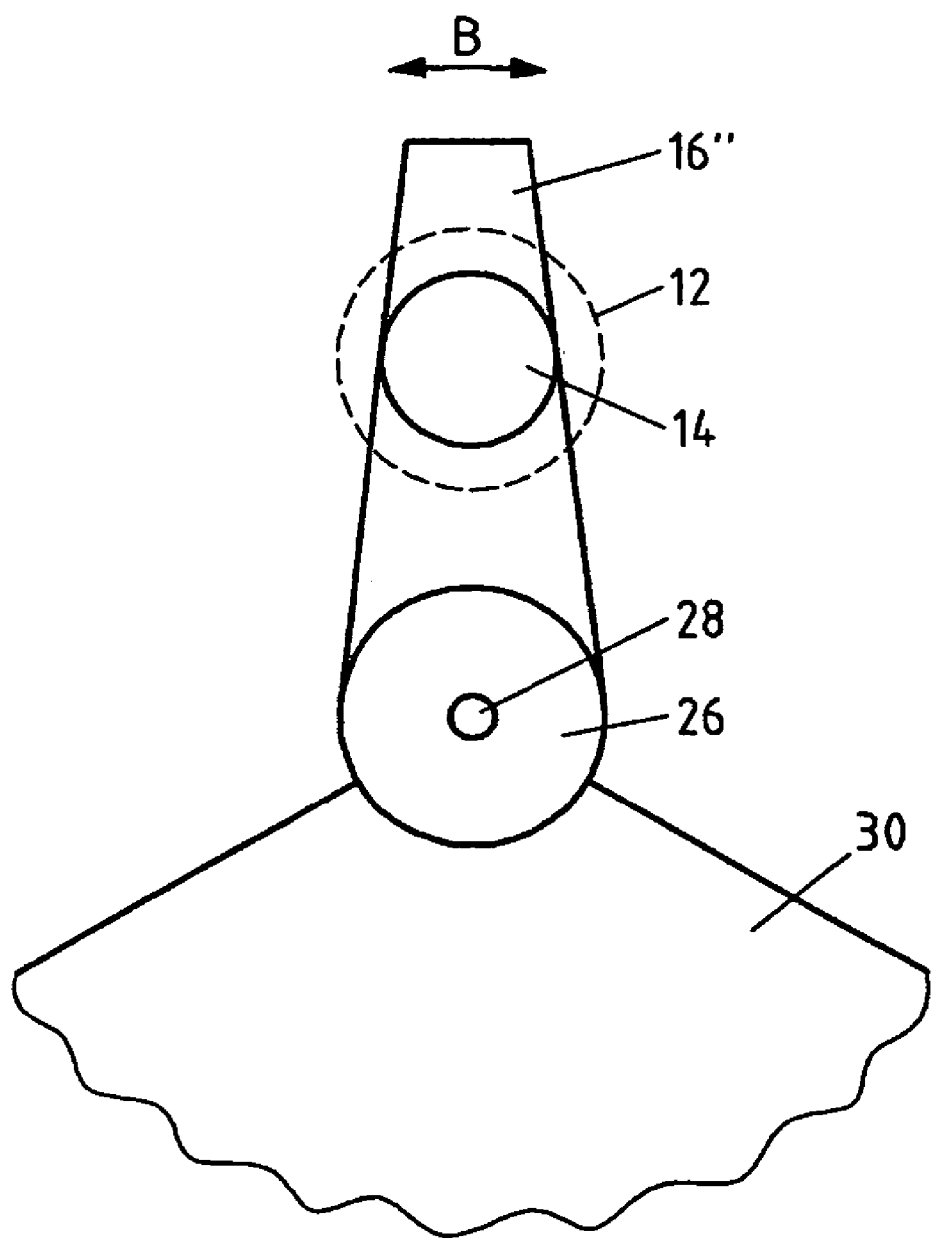
FIG. 3 shows a second exemplary embodiment of a drive device for moving the writing lens.

FIG. 3 shows a further example of a mounting and a drive for the lens holder 16". A rotary bearing 26 is provided, around the rotational axis 28 of which the lens holder 16", formed as an arm, oscillates resonantly in one rotational direction (arrow B). The drive used is a quasi-linear drive 30, covering a part of a circular segment. This linear drive is known from the prior art of the read-head drives for computer hard disks. In any case, an oscillating movement of the lens holder 16" in the range from 5–10 kHz can be produced by such a linear motor 48, because of the low mass and the powerful drive.

Hitherto, only the movement of the writing lens 14 relative to the storage medium 4 in the first direction of movement has been illustrated by using FIGS. 1 to 3. In order to write a two-dimensional digital hologram, a further movement in a second direction of movement is needed, preferably at right angles to the first direction of movement.

In FIGS. 1 and 2, the first direction of movement runs horizontally, as illustrated by the arrow A. The second direction of movement, on the other hand, runs at right angles to the plane of the drawing of FIG. 1 or vertically in FIG. 2. As has already been described above, there are various possible ways of implementing the movement of the write beam 12 relative to the storage medium 4. For this purpose, a second drive device is provided, which is not illustrated separately in the Figures. The configuration of this second drive device can be similar to the first drive device, but no such high requirements are placed on the speed of the second drive. The second drive device can generally be designed as a linear or quasi-linear drive.

A first possible way is for the second drive device to move the lens holder 16 of the writing lens 14 relative to the write beam 12 in the second direction of movement.

A second possible way is for the second drive device to move the laser 6, the collimation optics 10 and the lens holder 16 of the writing lens 14, including the frame 22, relative to the storage medium 4. For this purpose, the unit illustrated by the dashed line 32 in FIG. 1 is moved as a whole at right angles to the plane of the drawing.

A further possible way is for the second drive device to move the storage medium 4 itself relative to the laser 6, to the collimation optics 10 and to the writing lens 14.

Figure 4:
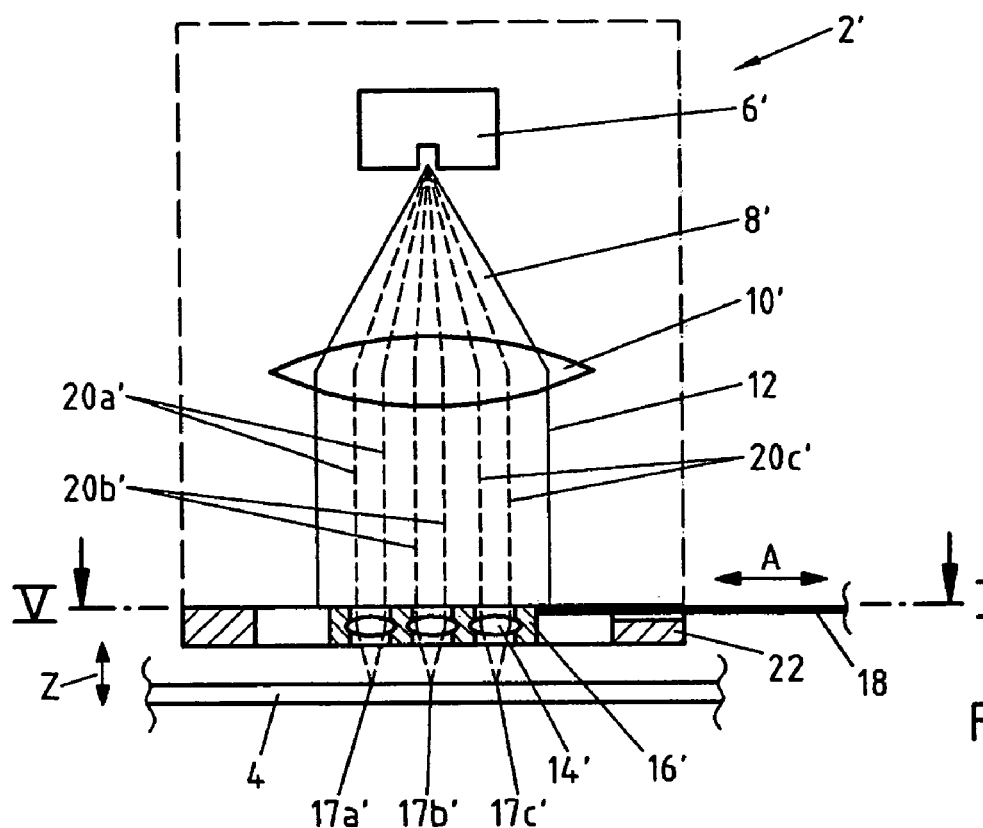
FIG. 4 shows a second exemplary embodiment of a lithograph according to the invention with an arrangement of a plurality of writing lenses.
Figure 5:
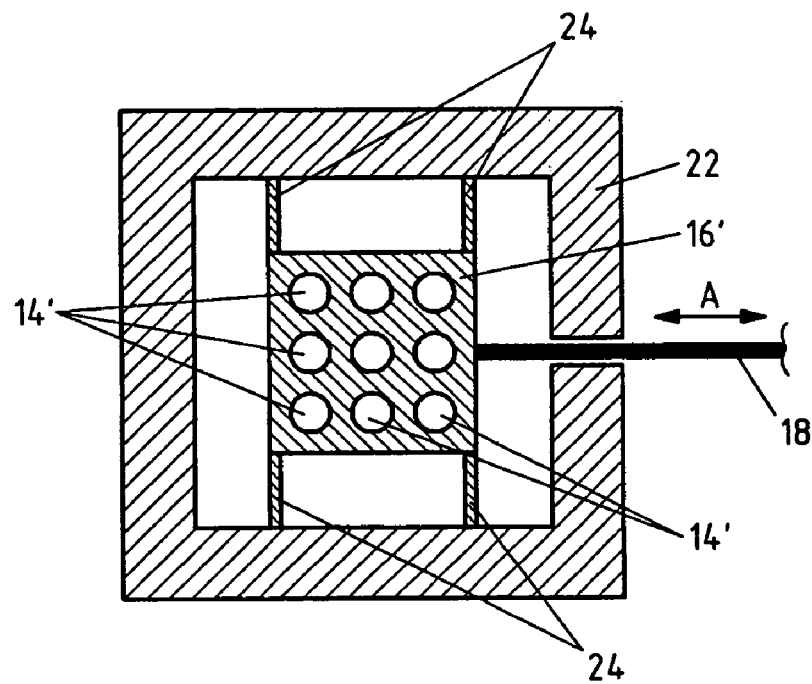
FIG. 5 shows the lithograph in cross section along the line V—V in FIG. 4, the lens holder and the linear drive being illustrated in a plan view.

A further, intrinsically independent configuration of a lithograph 2' according to the invention is illustrated in FIGS. 4 and 5. This lithograph 2' has largely the same constituent parts as the lithograph 2 illustrated in FIGS. 1 and 2. Identical elements are therefore provided with the same reference symbols.

As opposed to the laser 6 in FIG. 1, the lithograph 2' has a laser diode 6' for producing a divergent laser beam 8', a collimation lens 10' for collimating the write beam 12 with a predefined beam cross section, and at least one writing lens 14' for focusing the collimated write beam 12 onto the storage medium 4 to be written. In this case, the writing lens 14' is arranged in a lens holder 16'.

According to the invention, the writing lens 14' is formed as a microlens which has a dimension in the region of 1 mm, that is to say in a region of the size of the hologram to be written. The distance between the writing lens 14' and the storage medium 4 is thus reduced, so that the dimensions of the lithograph can at least partly be reduced. In addition, the writing lens 14' weighs less than the larger lens 14 according to FIGS. 1 and 2, so that the drive of the movement of the writing lens 14' can be matched to this.

FIGS. 4 and 5 show, moreover, that a plurality of writing lenses 14' arranged beside one another are provided, the write beam 12 illuminating the writing lenses 14' simultaneously. Thus, the parts 20*a*', 20*b*' and 20*c*' of the widened write beam 12 are simultaneously focused at a plurality of focal points 17*a*', 17*b*' and 17*c*', in order to change the optical properties of the material of the storage medium 4, in each case given a sufficient intensity of the write beam 12.

As shown in particular by FIG. 5, the writing lenses 14' are arranged in a 3×3 array. Of course, other array sizes are also possible, for example 2×2 or 4×4 or further sizes. By means of a relative movement of the write beam in relation to the storage medium, a plurality of digital holograms can thus be written simultaneously.

The configuration of the invention described above in relation to FIGS. 1 and 2 with respect to the drive of the lens holder 16 also applies in relation to the embodiment illustrated in FIGS. 4 and 5. This means that the array of writing microlenses 14', together with the holder 16', can be moved oscillating substantially at right angles to the write beam 12, in order, in the first direction of movement, to reach the regions to be written on the storage medium. Likewise, the various drive types for moving along the second direction of movement can be used, in order for each writing microlens 14' to cover a predefined two-dimensional region of the storage medium 4.

A further feature of the above-described configurations of the lithograph is that the distance between the storage medium 4 and the writing lens 14 in FIG. 1 or the writing microlenses 14' in FIG. 4 can be adjusted variably. This is identified by a double arrow designated "Z". For an adjustment of the distance in the z direction, means not illustrated in the Figures are provided. These can be any linear adjusting means which can be driven by motor or by hand. By means of adjusting the distance, the position of the focus in the storage medium 4 can be arranged at various depths, and likewise adjustment of the focus in the case of storage media 4 of different thicknesses is possible.

Finally, at least two digital holograms can be written at different levels within the storage medium 4, in order to produce what are known as multilayer holograms.

Figure 6:
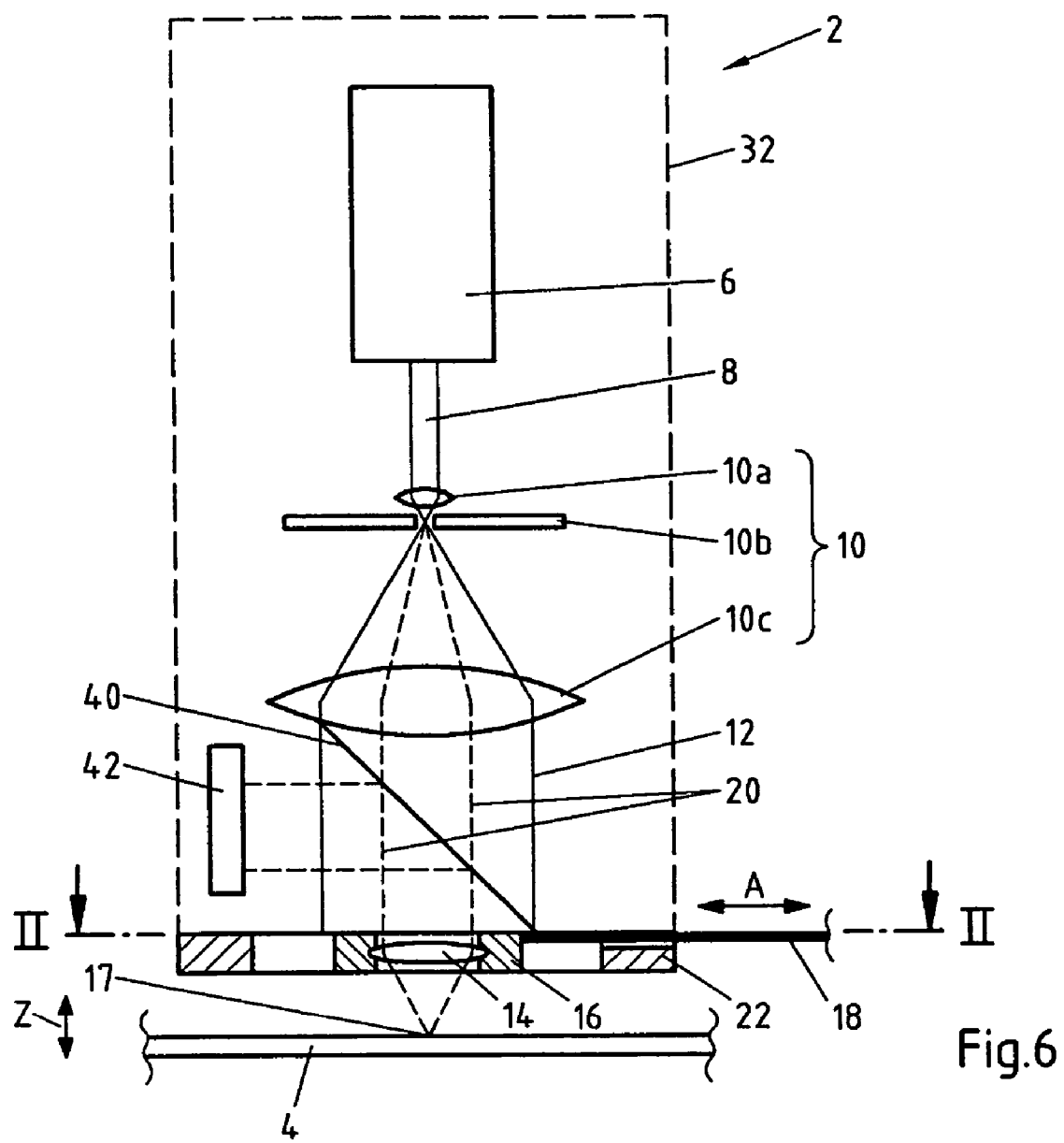
FIG. 6 shows a microscope according to the invention with a structure which corresponds substantially to the structure of the lithograph illustrated in FIG. 1.

FIG. 6 illustrates a microscope according to the invention which, in its structure, corresponds to the lithograph illustrated in FIG. 1. Therefore, identical designations designate identical components to those that have been described in connection with FIG. 1, even if, in detail, other designations are used which identify the difference between writing and scanning or observing.

In addition to the structure illustrated in FIG. 1, a deflection plane 40 is arranged in the beam path of the light reflected from the surface, behind, that is to say above, the lens 14. This can be implemented by means of a semitransparent mirror or a beam splitter and has no influence or only an insignificant influence on the observation beam.

The deflection plane 40 deflects the reflected beam laterally, to the left in FIG. 6, so that it strikes a photosensor 42 which measures the intensity of the reflected light.

By varying the position of the lens 14 relative to the object 4 to be viewed under the microscope, the surface is then scanned or observed and the reflectance measured point by point. An image of the scanned surface can thus be assembled.

If, then, the light beam emitted by the light source 6, which can be designated an observation beam in the microscope, is produced with a substantially identical intensity, then the measured intensity of the reflected beam is a measure of the reflectance of the scanned surface.

The invention claimed is:

1. A lithographic device for producing digital holograms in a storage medium,
    having a light source for producing a write beam with a predefined beam cross section,
    having a writing lens for focusing the write beam onto the storage medium to be written, the writing lens being arranged in a lens holder, and
    having drive means for two-dimensional movement of the write beam relative to the storage medium,
    wherein
    the drive means include a first drive device for moving the lens holder substantially at right angles to the write beam and
    an aperture of the writing lens is smaller than the beam cross section of the write beam.

2. The device as in claim 1, wherein the drive device is formed as a linear motor or as a voice coil motor.

3. The device as in claim 1, wherein the mounting of the lens holder is formed as solid-state bearings, ball bearings, sliding bearings, air bearings or magnetic bearings.

4. The device as in claim 1, wherein the lens holder is linearly mounted and oscillates resonantly in one direction.

5. The device as in claim 1, wherein the lens holder is rotationally mounted and oscillates resonantly in one rotational direction.

6. The device as in claim 5, wherein the lens holder oscillates at a frequency greater than 1 kHz.

7. The device as in claim 1, wherein
    in that the first drive device moves the writing lens in a first direction of movement and
    in that the drive means include a second drive device for moving the write beam relative to the storage medium in a second direction of movement transversely with respect to the first direction of movement.

8. The device as in claim 7, wherein the second drive device moves the lens holder of the writing lens relative to the write beam.

9. The device as in claim 7, wherein the second drive device moves the light source and the lens holder of the writing lens relative to the storage medium.

10. The device as in claim 7, wherein the second drive device moves the storage medium relative to the light source and the lens holder of the writing lens.

11. A device as in claim 1, wherein the writing lens is formed as a microlens.

12. The device as in claim 11, wherein at least two writing lenses arranged beside each other are provided, the write beam illuminating at least two writing lenses simultaneously.

13. The device as in claim 12, wherein the writing lenses are arranged in an array.

14. The device as in claim 1, wherein means are provided for adjusting the distance between the storage medium and the writing lens.

15. A method for the lithographic production of digital holograms in a storage medium with a lithographic device of claim 1,
    wherein a write beam being focused onto the storage medium with the aid of a light source and a writing lens and being moved two-dimensionally relative to the storage medium with the aid of drive means,
    wherein the writing lens is moved relative to the optical storage medium in a first direction of movement substantially at right angles to the propagation direction of the write beam,
    wherein within the range of movement of the writing lens, the aperture of the writing lens is illuminated substantially completely by the write beam, and
    wherein the hologram is written by introducing radiation energy point by point, the intensity of the write beam being controlled as a function of the position of the write beam on the storage medium.

16. The method as in claim 15, wherein the writing lens is moved relative to the storage medium in a second direction of movement transversely with respect to the first direction of movement.

17. The method as in claim 15, wherein the light source and the writing lens are moved relative to the storage medium.

18. The method as in claim 15, wherein the storage medium is moved relative to the light source and writing lens.

19. The method as in claim 15, wherein an orthogonal point pattern on the storage medium is scanned with the aid of the write beam.

20. The method as in claim 19, wherein the relative movement between write beam and storage medium in the second direction of movement is carried out discontinuously during the movement of the writing lens in the first direction of movement.

21. The method as in claim 20, wherein during the movement of the write beam in the first direction of movement along the area of the storage medium to be written, the write beam is not moved in the second direction of movement and wherein, during the movement of the write beam in the first direction of movement along the area of the storage medium not to be written, the write beam is moved by one step transversely with respect to the first direction of movement.

22. The method as claimed in claim 19, wherein during the movement of the write beam in the first direction of movement, the write beam is moved continuously in the second direction of movement.

23. The method as claimed in claim 15, wherein with the aid of at least two writing lenses which are arranged beside each other and are designed in the form of writing microlenses, holograms are written on the storage medium simultaneously.

24. The method as in claim 15, wherein the distance between the writing lens and the storage medium is set to write at various depths within the storage medium.

25. The method as in claim 23, wherein the distance between the writing microlenses and the storage medium is set to write at various depths within the storage medium.

* * * * *